US011645143B2

(12) United States Patent
Panesar

(10) Patent No.: US 11,645,143 B2
(45) Date of Patent: May 9, 2023

(54) ERROR DETECTION WITHIN AN INTEGRATED CIRCUIT CHIP

(71) Applicant: SIEMENS INDUSTRY SOFTWARE INC., Plano, TX (US)

(72) Inventor: Gajinder Panesar, Bristol (GB)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 16/528,394

(22) Filed: Jul. 31, 2019

(65) Prior Publication Data

US 2020/0089562 A1 Mar. 19, 2020

(30) Foreign Application Priority Data

Sep. 14, 2018 (GB) ..................... 1815044

(51) Int. Cl.
*G06F 11/00* (2006.01)
*G06F 11/07* (2006.01)
*G06F 13/40* (2006.01)

(52) U.S. Cl.
CPC ...... *G06F 11/0793* (2013.01); *G06F 11/0745* (2013.01); *G06F 11/0751* (2013.01); *G06F 13/4027* (2013.01)

(58) Field of Classification Search
CPC ............ G06F 11/073; G06F 11/0751; G06F 11/0766; G06F 11/0769; G06F 11/0772; G06F 11/0775; G06F 11/0778; G06F 11/0781; G06F 11/0784; G06F 11/0787; G06F 11/08; G06F 11/14; G06F 11/1479; G06F 11/16; G06F 11/22; G06F 11/0793; G06F 11/0745; G06F 11/1004; G06F 11/3037; G06F 11/3027; G06F 11/0724; G06F 13/4027; G11C 2029/0409; G11C 29/52; G01F 13/31717; G01F 13/31705
USPC ....................................... 714/1–57
See application file for complete search history.

(56) References Cited

U.S. PATENT DOCUMENTS

| 7,020,076 B1 * | 3/2006 | Alkalai ............ H04L 1/22 370/217 |
| 9,529,686 B1 * | 12/2016 | Arbel ............. G06F 11/10 |
| 9,632,869 B1 * | 4/2017 | Lu ................. G06F 11/1052 |

(Continued)

FOREIGN PATENT DOCUMENTS

| EP | 0811916 A2 | 12/1997 |
| WO | 2013/101140 A1 | 7/2013 |

OTHER PUBLICATIONS

Extended European Search Report dated Jan. 27, 2020 in European Application No. 19190619.7.

*Primary Examiner* — Sarai E Butler
(74) *Attorney, Agent, or Firm* — Lempia Summerfield Katz LLC

(57) ABSTRACT

A method of performing error detection within an integrated circuit chip analyses transactions communicated over interconnect circuitry of the integrated circuit chip to detect whether a message contains a data error. A memory of the integrated circuit chip coupled to the interconnect circuitry is scanned to detect whether there is a data error stored in the memory, and in response to detecting a data error in a transaction communicated over the interconnect circuitry and/or a data error stored in the memory, a dedicated action indicative of a data error is performed.

22 Claims, 4 Drawing Sheets

(56) References Cited

U.S. PATENT DOCUMENTS

| | | |
|---|---|---|
| 2003/0208704 A1* | 11/2003 | Bartels .................. H04L 1/22 |
| | | 714/11 |
| 2007/0180337 A1* | 8/2007 | Courtney ............... G11B 20/18 |
| | | 714/54 |
| 2007/0226597 A1 | 9/2007 | Taito et al. |
| 2008/0163007 A1* | 7/2008 | Shaeffer .............. G06F 11/1004 |
| | | 714/52 |
| 2012/0042174 A1* | 2/2012 | Zaydman ................ G06F 16/20 |
| | | 713/189 |
| 2012/0226839 A1 | 9/2012 | Fuoco et al. |
| 2013/0132805 A1 | 5/2013 | Radke et al. |
| 2014/0040680 A1* | 2/2014 | Takaku .................. G06F 11/08 |
| | | 714/54 |
| 2014/0052930 A1 | 2/2014 | Gulati et al. |
| 2015/0220400 A1* | 8/2015 | Resch ................ G06F 11/1076 |
| | | 714/6.2 |
| 2015/0248326 A1* | 9/2015 | Fitzpatrick .......... G11C 11/5628 |
| | | 714/6.11 |
| 2016/0047859 A1 | 2/2016 | Deutsch et al. |
| 2016/0055096 A1 | 2/2016 | Chirca et al. |
| 2019/0013086 A1* | 1/2019 | Spencer ................ G06F 3/0656 |

* cited by examiner

ERROR DETECTION WITHIN AN INTEGRATED CIRCUIT CHIP

This application claims the benefit of UK Patent Application No. GB 1815044.1, filed on Sep. 14, 2018, which is hereby incorporated by reference in its entirety.

FIELD

The present embodiments relate to performing error detection within an integrated circuit chip and taking a dedicated action in response to detecting an error.

BACKGROUND

In the past, an embedded system that had multiple core devices (e.g., processors, memories etc.) would have been incorporated onto a printed circuit board (PCB) and connected on the PCB via buses. Traffic in the embedded system was conveyed over these buses.

Market demand for smaller products coupled with advances in semiconductor technology has led to the development of System-on-Chip (SoC) devices. In a SoC, the multiple core devices of an embedded system are integrated onto a single chip. In a SoC, the traffic in the embedded system is conveyed over internal buses.

The integrity of data that is communicated within SoC devices is of concern, particularly as SoC devices are increasingly implemented within devices such as smartphones, cameras, computers, laptops etc. The corruption of data may be referred to as a data error, or equivalently an error in the data, and refers to the alteration of data (e.g. a change in one or more bits of the data) from its correct form. Data errors may occur due to a variety of reasons, including malicious entities (e.g. viruses and malware), hardware or system malfunctions, or software corruption.

Undetected data errors may be referred to as silent data corruption. Data errors that are left undetected may propagate throughout the SoC as that corrupted data is communicated through and used by various components of the SoC. This propagation may cause an initially benign error (e.g., a bit error) to evolve into a more potent threat that in more extreme cases may lead to cascading failures within the SoC.

SUMMARY AND DESCRIPTION

The scope of the present disclosure is defined soley by the appended claims and is not affected to any degree by the statements within this description.

According to the present embodiments, a method of performing error detection within an integrated circuit chip is provided. The method includes analyzing transactions communicated over interconnect circuitry of the integrated circuit chip to detect whether a transaction contains a data error. The method also includes scanning a memory of the integrated circuit chip coupled to the interconnect circuitry to detect whether there is a data error stored in the memory. The method includes performing a dedicated action indicative of a data error in response to detecting a data error in a transaction communicated over the interconnect circuitry and/or a data error in a transaction communicated over the interconnect circuitry and/or a data error stored in the memory.

The act of scanning the memory of the integrated circuit chip may be performed by detection circuitry coupled to the interconnect circuitry. The method includes scanning the memory of the integrated circuit chip at times when the interconnect circuitry is free.

The act of scanning the memory of the integrated circuit chip may include scanning one or more blocks of the memory to detect whether the one or more blocks contain a data error.

The method may include detecting whether a block of the memory contains a data error by: scanning that block of the memory at a first time; generating a first characterization of the data read from the block at the first time and storing that first characterization; scanning that block of memory at a second time subsequent to the first time; generating a second characterization of the data read from the block at the second time and comparing the second characterization to the first characterization; and detecting that the data in the block contains an error if the first characterization and the second characterization do not match.

The block of memory may be scanned at the second time only if no data has been written to that block between the first time and the second time.

The first characterization may be a first hash value generated from the data read from the block at the first time, and the second characterization is a second hash value generated from the data read from the block at the second time.

The method may include detecting whether a block of memory contains a data error by: scanning that block of memory at a first time; generating a first characterization of the data read from the block at the first time and storing that first characterization; scanning that block of memory at a second time subsequent to the first time; generating a second characterization of the data read from the block at the second time and comparing the second characterization to the first characterization; and detecting that the data in the block contains an error if the first characterization and the second characterizations do match.

The first characterization may be a first hash value generated from the data read from the block at the first time, and the second characterization may be a second hash value generated from the data read from the block at the second time.

The method may include scanning a block of the memory to detect whether that block contains a data error in response to detecting that the block is scheduled to be used in a communication over the interconnect circuitry.

The method may include detecting that the block is scheduled to be used in a communication over the interconnect circuitry from the analysis of the transactions over the interconnect circuitry.

The method may include detecting that the block is expected to be used in a communication over the interconnect circuitry in response to identifying a message of a transaction over the interconnect circuity specifying an address within that block.

The one or more scanned blocks of memory may include blocks of read-only memory.

The act of analyzing transactions communicated over the interconnect circuitry may include performing on one or more messages of each transaction a parity check to detect whether that message contains a data error.

The act of analyzing transactions communicated over the interconnect circuity may include performing on one or more messages of each transaction a cyclic redundancy check to detect whether that message contains a data error.

The dedicated action performed in response to detecting data error in the memory may include one or more of: correcting the error in the data and writing the corrected data back to the memory; generating an alert signal; and blocking access to the data error in the memory.

The dedicated action performed in response to detecting a data error in a message of a transaction communicated over the interconnect circuitry may include one or more of: correcting the error and communicating a message containing corrected data; communicating an indication of the error to the entity from which the message was communicated; and generating an alert signal.

The method may further include recording information associated with detected data errors in transactions communicated over the interconnect circuitry and/or detected data errors stored in the memory over time to generate an error profile.

The method may further include analyzing transactions communicated over the interconnect circuitry selected in dependence on the error profile.

The method may include using the error profile to direct the scanning of the memory.

The method may include scanning one or more blocks of the memory selected in dependence on the error profile.

The method may include scanning the memory at selected times in dependence on the error profile.

The method may further include recording information indicative of activity levels of the interconnect circuitry and/or memory over time to generate an activity profile.

The method may include analyzing transactions communicated over the interconnect circuitry within a time interval indicated by the activity profile to have a level of activity exceeding a specified threshold.

The method may include scanning one or more blocks of memory selected in dependence on the activity profile and/or scanning the memory at selected times in dependence on the activity profile.

According to a second aspect of the present disclosure, an integrated circuit chip is provided. The integrated circuit chip includes interconnect circuitry for transporting messages, a memory coupled to the interconnect circuitry, and detection circuitry. The detection circuitry is configured to: analyze transactions communicated over interconnect circuitry of the integrated circuit chip to detect whether there is a data error stored in the memory; scan the memory to detect whether data stored in the memory contains an error; and in response to detecting a data error in a transaction communicated over the interconnect circuitry and/or an error in the data stored in the memory, perform a dedicated action indicative of a data error.

DETAILED DESCRIPTION

The following disclosure describes detection circuitry for performing error detection within an integrated circuit chip. The detection circuitry may be implemented on the integrated circuit chip. The detection circuitry may, for example, be implemented within a bus monitor, bus master or direct memory access (DMA) controller. The integrated circuit chip may be a system-on-chip (SoC) or a multi-chip module (MCM). The detection circuitry may perform two types of data error detection: (i) error detection on data communicated over interconnect circuitry of the integrated circuit chip; and (ii) error detection on data stored in a memory of the integrated circuit chip. The detection circuitry may perform a first type of error detection by analyzing transactions communicated over the interconnect circuitry. The transactions may be analyzed by performing an error detection check on the transaction (e.g., a cyclic redundancy check (CRC) or a parity bit check). The detection circuitry may perform a second type of error detection by scanning the memory to detect whether data within the memory contains an error (e.g., whether data within the memory is corrupted). The detection circuitry may scan regions of the memory.

In other words, the detectin circuitry may scan the memory on a per-region basis. A region of memory may be scanned to determine whether data within that region has been corrupted. In response to detecting a data error (e.g., either within a transaction being communicated over the interconnect circuitry and/or within the memory), the detection circuitry performs a dedicated action. That dedicated action may be indicative of a data error detection. The dedicated action may, for example, be a remedying action, such as correcting the detected error, generating an alert signal, and/or blocking access to the region of memory containing the data error.

Figure 1:
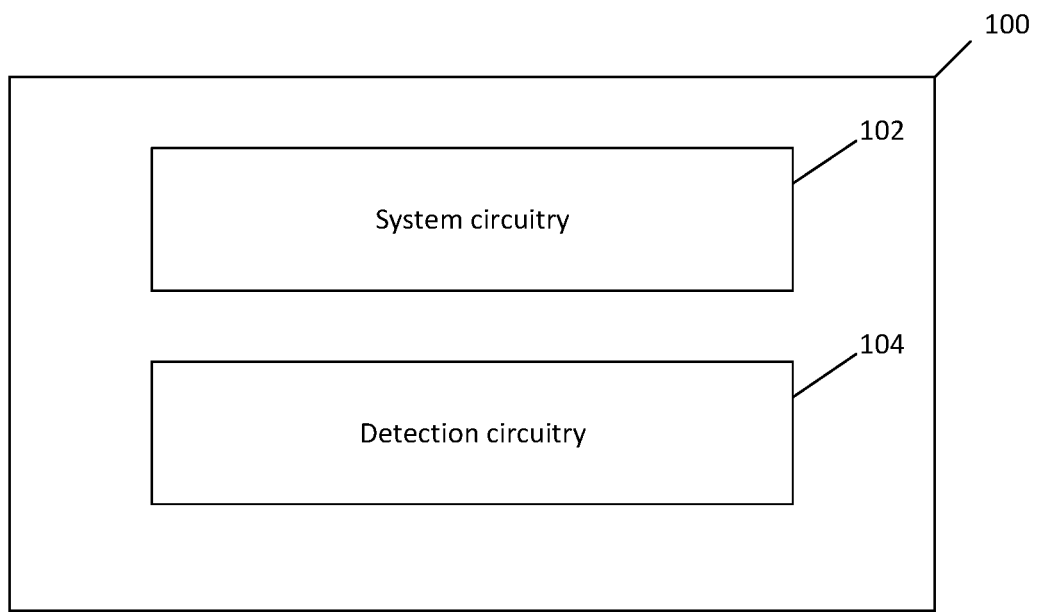
FIG. 1 is a schematic diagram of an architecture on an integrated circuit chip.
Figure 2:
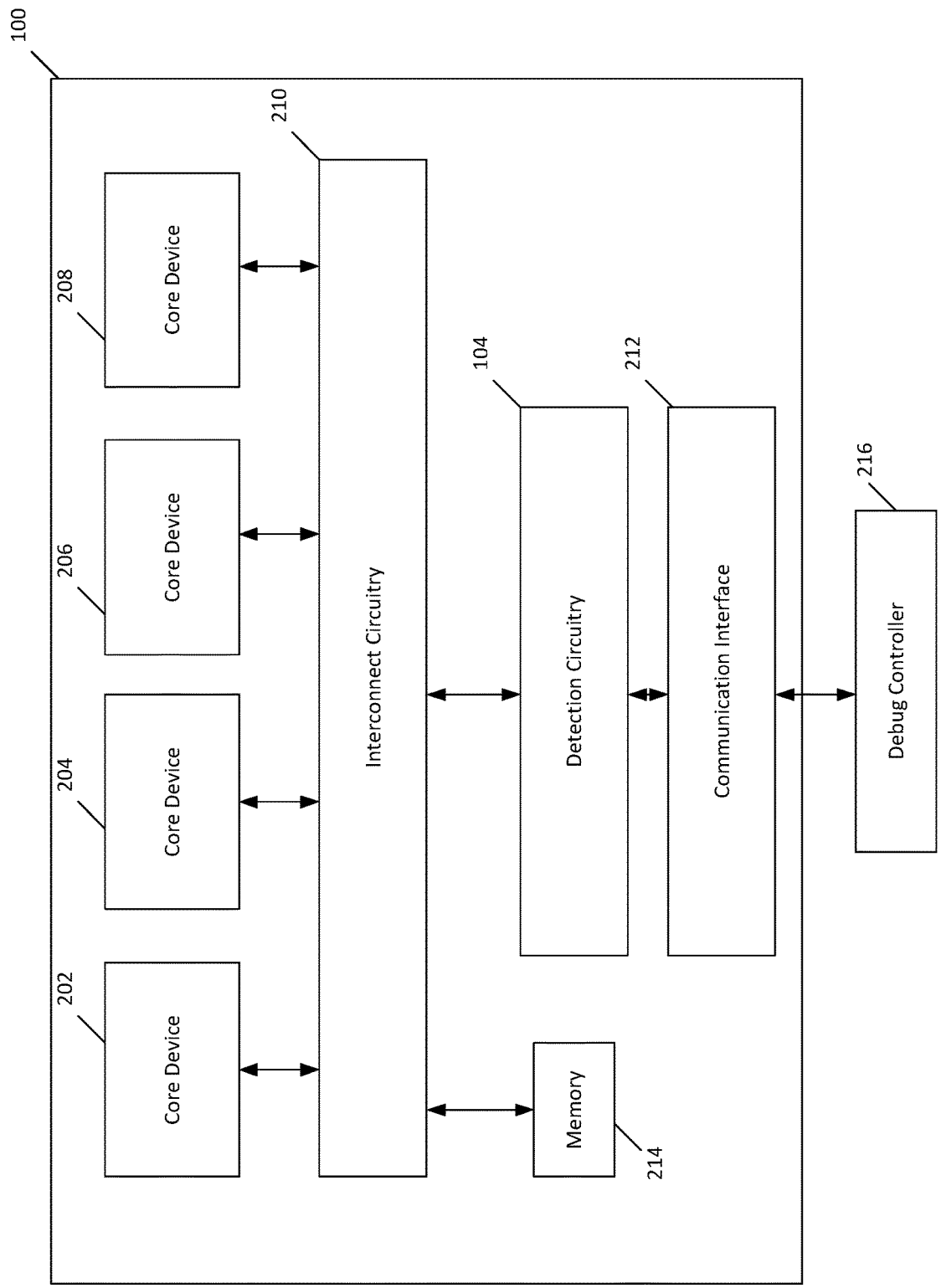
FIG. 2 is a further schematic diagram of the architecture on an integrated circuit chip.
Figure 3:
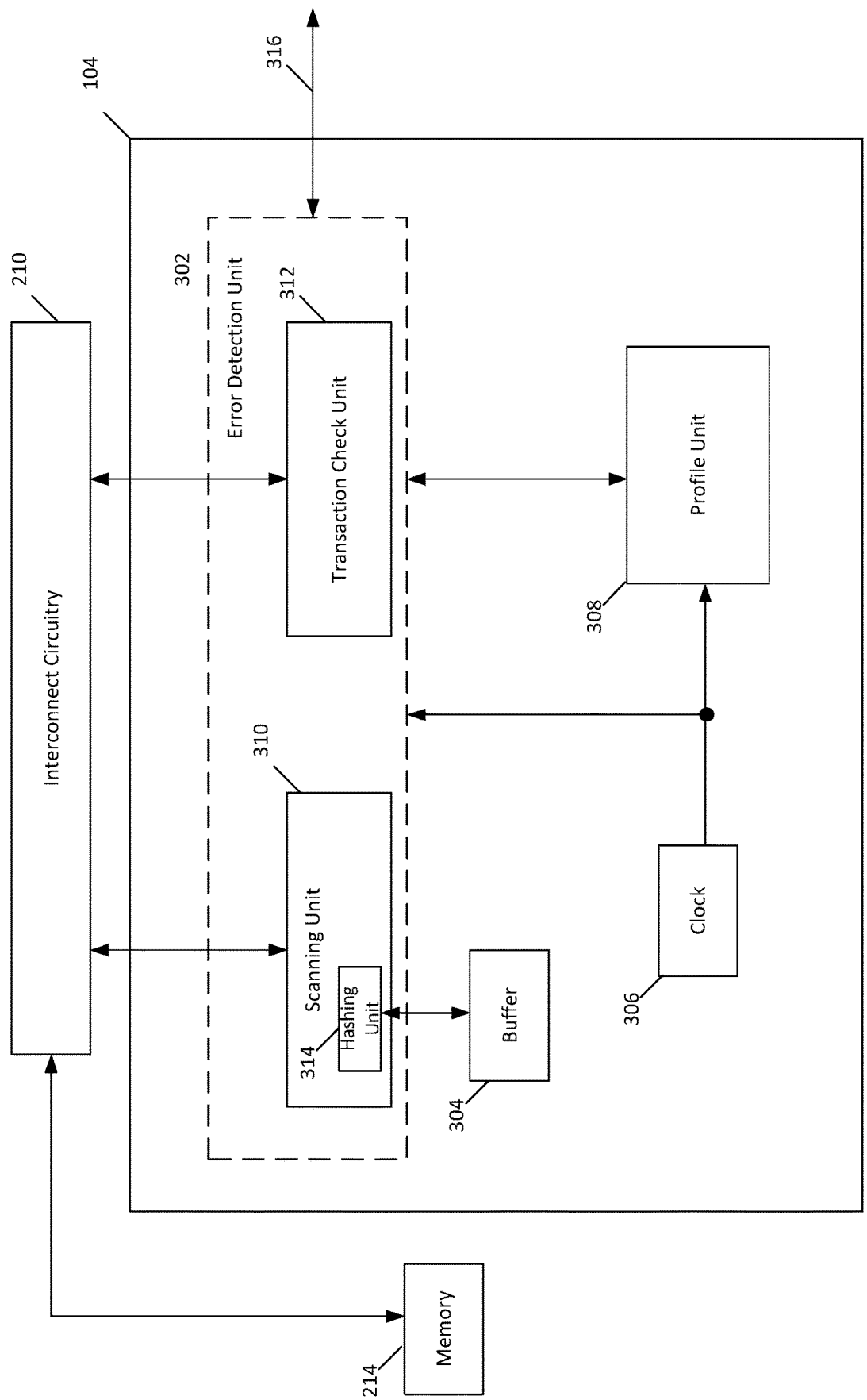
FIG. 3 is a schematic diagram showing components of exemplary detection circuitry for performing data error detection within the integrated circuit chip.

FIGS. 1 to 3 are schematic diagrams of SoC architectures, and components within SoC architectures. These figures present the structures in terms of functional blocks.

Some functional blocks for carrying out functions well known in the art have been omitted. The functional blocks may not delineate different physical structures and may not define a strict division between different logical elements of the SoC device. Each functional block may be implemented in hardware, software, or a combination thereof.

Figure 4:
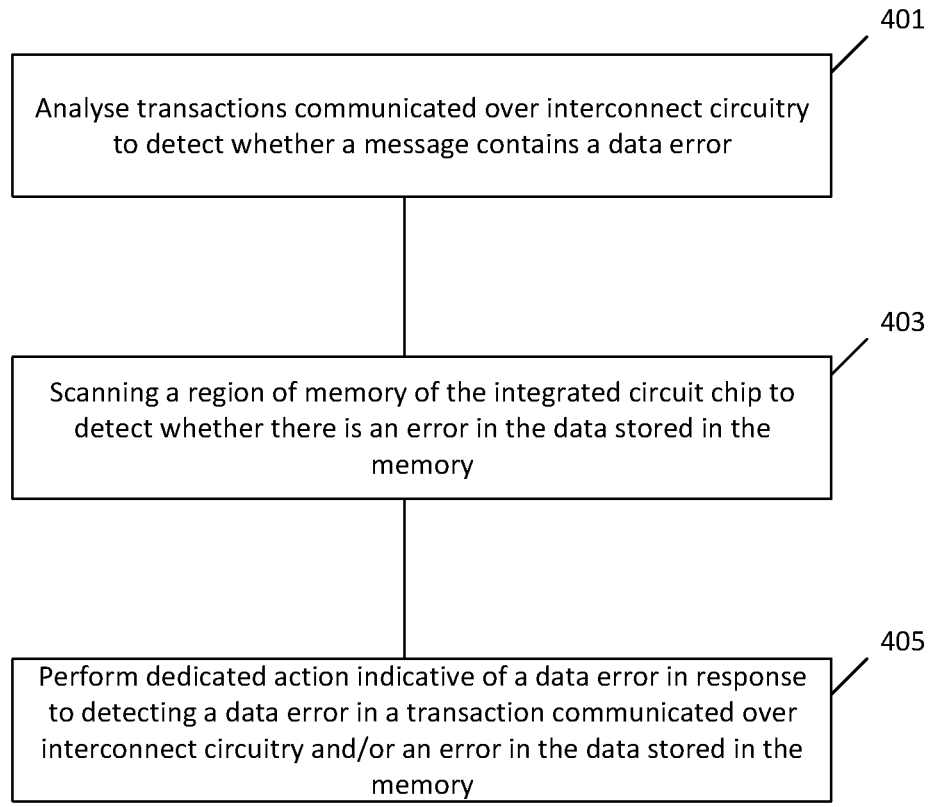
FIG. 4 shows a flowchart of acts for performing error detection within an integrated circuit chip.

FIG. 4 shows a flowchart of acts of a method of performing error detection within an integrated circuit chip. However, the flowchart is not intended to restrict the order in which the acts of the method may be performed. The acts of the method may be carried out in alternative orders to that depicted in FIG. 4. The acts of the method may also be implemented concurrently with each other so that the implementation of different acts may at least partially overlap in time. This will be explained in more detail below.

FIG. 1 illustrates the general structure of an exemplary monitoring architecture for a SoC 100. The SoC includes system circuitry 102 and detection circuitry 104. The detection circuitry is arranged to detect data errors within the system circuitry and to perform a dedicated action in response to detecting a data error.

FIG. 2 shows a more detailed view of the exemplary architecture of the SoC 100. The system circuitry is shown including a number of core devices 202, 204, 206, 208, interconnect circuitry 210, a communication interface 212, and a memory 214. Although four core devices are shown here, this is merely for the purposes of illustration, and any number of core devices may suitably be implemented within the SoC 100. Exemplary core devices include a digital signal processor (DSP), video processor, applications processor or central processor unit (CPU), graphics processor or graphics processor unit (GPU), system memory, bus, software, data, custom circuit and a data engine. This list of examples is non-limiting, and any component of a SoC is suitable for being incorporated into the architecture shown in FIG. 2 as a core device. The core devices may be emulators or simulators of other devices on the chip. For example, a core device may emulate a processor.

Each core device is shown connected to the detection circuitry 104 via interconnect circuitry 210. The interconnect circuitry 210 may be a bus or bus network. Alternatively, the interconnect circuitry 210 may be a network of nodes (e.g., a mesh network of nodes), a ring network, or a shared hub. Alternatively, the interconnect circuitry may include any combination of one or more shared hubs, buses, ring networks and mesh networks. The interconnect circuitry 210 is a further example of a core device; however, the system interconnect circuitry is shown in FIG. 2 as a separate component 210 for the purpose of clarity.

The interconnect circuitry 210 transports data between components of the SoC. The data may be communicated over the interconnect circuitry in the form of discrete messages. The messages may form part of transactions between components of the SoC governed by a transaction protocol. In other words, a transaction may involve one or more messages being communicated between components of the SoC. In other words, the interconnect circuitry may transport data between the components of the SoC as transactions in accordance with a transaction protocol. The interconnect circuitry may, for example, support transactions between different core devices. Each transaction message communicated over the interconnect circuitry may include a number of fields. Each message may, for example, include an address field. The address field may contain an indication of the source and/or destination address. The address field may for example store a source ID (e.g., the ID of the device/component that initiated communication of the message). The device or component that initiated communication of the message may be referred to as the initiator. Thus, the address field may contain an ID for the initiator. The address field may additionally store a destination ID (e.g., the ID of the intended recipient device/component of the message). The device/component that initiated the transaction may be referred to herein as a master device/component. Alternatively, or in addition, the address field may contain an indication of the address of the device or component within the SoC that is a party to the transaction but did not initiate the transaction (which may be referred to herein as a slave device/component). For example, the address field may contain an ID of a or each (slave) device/component that is a party to the transaction. Thus, a master device may initiate (and terminate) a transaction. A slave device may listen to the interconnect circuitry for messages. A slave device may be the device addressed by the master device. Each device of the SoC may also be a transmitter device, a receiver device, or both. A transmitter device is a device that transmits messages to the interconnect circuitry 210. A receiver device is a device that receives data from the interconnect circuitry. Transmitter/receiver devices are not necessarily master/slave devices, respectively. For example, it is possible for a master device to operate as a receiving device; equally, it is possible for a slave device to operate as a transmitter device. In some examples, the communication protocol that governs transactions over the interconnect circuitry 210 may specify that only one master device may be active at a time.

Memory 214 is shown connected to the interconnect circuitry 210. The memory 214 may be a non-volatile memory. Memory 214 may be the system memory of the SoC 100. Although the system memory has been described above as an example of a core device, memory 214 (like interconnect circuitry 210) is shown as a separate component for the purposes of clarity. Memory 214 may be formed of one or more physical memory devices, which may be either physically connected or separate. Memory 214 may be formed of multiple sub-regions or portions referred to as memory blocks. In other words, a block of memory may be referred to herein as a portion of memory. Memory 214 may be formed of multiple blocks. The blocks may be of equal size or different sizes to each other.

The detection circuitry 104 is connected to the interconnect circuitry 210 and is configured to perform error detection within the SoC 100. In other words, the detection circuitry 104 is configured to detect data errors within the SoC 100. In some of the examples described herein, the detection circuitry 104 performs error detection on data communicated over the interconnect circuitry 210, and error detection on data stored in the memory 214. In other words, the detection circuitry 104 may perform two types of error detection: a first type of error detection on data communicated over the interconnect circuitry; and a second type of error detection on data stored in memory 214. This will be explained in more detail below.

The detection circuitry 104 is shown connected to communication interface 212. Communication interface 212 may be configured to communicate with entities off chip (e.g., entities external to the chip 100). For example, the detection circuitry 104 may communicate with an off-chip debug controller 216 via the communication interface 212, for example, by communicating information on detected data errors within the SoC. Communication interface 212 may also be configured to communicate with other entities on-chip. For example, detection circuitry 104 may communicate with an on-chip debug controller (not shown in FIG. 2) via communication interface 212. Although FIG. 2 illustrates one communication interface, any number of communication interfaces may be integrated onto the SoC 100. The communication interfaces implemented are chosen in dependence on the type of connections that are to be made. Exemplary communication interfaces include: traditional debug interfaces such as JTAG, parallel trace input/output, and Aurora based high-speed serial interface; and reuse of system interfaces such as USB, Ethernet, RS232, PCIe, and CAN.

A method will now be described in which data errors within system circuitry 102 of the SoC 100 are detected and dedicated actions are taken in response to detecting the errors. This method will be described with reference to the flow chart in FIG. 4.

At act 401, the detection circuitry 104 performs a first type of data error detection to detect errors in data communicated over the interconnect circuitry 210. The detection circuit performs this error detection by analyzing transactions communicated over the interconnect circuitry 210 to detect whether a transaction contains a data error. In other words, the detection circuitry 104 may detect for each analyzed transaction whether that transaction contains a data error. The detection circuitry 104 may analyze each message forming part of a transaction to determine whether that transaction contains a data error. A transaction may be taken to contain a data error if at least one message forming part of the transaction contains a data error.

At act 403, the detection circuitry 104 performs a second type of data error detection to detect errors in data stored in the memory 214. The detection circuitry 104 performs this error detection by scanning the memory 214 to detect whether there is an error in the data stored in the memory 214 (e.g., whether there is a data error stored within the memory).

An exemplary structure of the detection circuitry 104 that may perform the first and second types of data error detection is shown in FIG. 3.

As shown, the detection circuitry 104 includes: an error detection unit 302; a local storage unit 304 that, in this example, is a buffer; a clock 306; and a profile unit 308. The error detection unit 302 is coupled to the interconnect circuitry 210. The error detection unit 302 includes a scanning unit 310 and a transaction check unit 312, each coupled to the interconnect circuitry 210. The scanning unit 310 may optionally include a hashing unit 314, as an example. In the example shown, the hashing unit 314 is coupled to the buffer 304. The clock 306 is coupled to the error detection unit 302 and the profiling unit 308. The profiling unit is also coupled to the error detection unit 302.

The transaction check unit 312 is configured to analyze transactions communicated over the interconnect circuitry 210 to detect, for each of those transactions, whether the transaction contains a data error (e.g., act 401 is performed by the transaction check unit 312). As indicated above, the transaction check unit 312 may analyze messages of a transaction to determine, for each of those analyzed messages, whether the message contains a data error. The transaction check unit 312 may analyze a transaction to perform error correction by performing some form of check calculation on the transaction. The transaction check unit 312 may, for example, perform a parity check, or a cyclic redundancy check (CRC), on each analyzed message of a transaction.

If parity checking is to be performed, each message communicated over the interconnect circuitry 210 may include a parity bit. The parity bit may be included in each message to make the number of binary bits in the message having a value of '1' equal to either an odd number (e.g., for odd-parity) or an even number (e.g., for even parity). The parity bit may be referred to as an even parity bit if even parity is being implemented, and an odd parity bit if odd parity is being implemented. The transaction check unit 312 may then analyze a message of a transaction by performing a parity check to determine whether the number of bits in the message having a value of '1' was odd or even. If even parity were being used, the transaction check unit 312 may detect there is no data error in the message in response to determining the message contained an even number of bits having the value '1', and may detect that there is a data error in the message in response to determining the message contained an odd number of bits having the value '1'. In contrast, if odd parity were being used, the transaction check unit 312 may detect there is no data error in the message in response to determining the message contained an odd number of bits having the value '1', and may detect there is a data error in the message in response to determining the message contained an even number of bits having the value '1'.

If CRC checking is to be performed, each message communicated over the interconnect circuitry may include a check value. The check value depends on the remaining content of the message. The transaction check unit 312 may then analyze a message by re-calculating the check value based on the contents of the message. The re-calculated check value may then be compared to the check value included within the message. The transaction check unit 312 detects that the message does not contain a data error if the check values match, and detects that the message does contain a data error if the check values do not match.

The transaction check unit 312 may analyze messages communicated over the interconnect circuitry 210 while the interconnect circuitry 210 continues operating under normal conditions; in other words, the transaction check unit 312 may be non-intrusive (e.g., the transaction check unit 312 does not affect the communications over the interconnect circuitry 210). Data communicated between two entities of the chip 100 may therefore be unaffected by the operation of the transaction check unit 312. To operate in a non-intrusive manner, the transaction check unit 312 may store a copy of the message to be analyzed. The copy of the message may be stored locally within the detection circuitry 104 (e.g., within the error detection unit 302). The transaction check unit 312 may then perform the check calculation on the message copy. Following completion of the check calculation, the copy of the message may be deleted by the transaction check unit 312 to minimize storage requirements. In an alternative implementation, the transaction check unit 312 may extract each message to be analyzed from the interconnect circuitry 210. In other words, the transaction check unit 312 may remove a message to be analyzed from the interconnect circuitry. The advantage of this approach is that, if the message is determined to contain a data error, the message may be prevented from being propagated through the SoC. The SoC 100 may have a different architecture to that illustrated in FIG. 3 if the transaction check unit 312 were to extract messages from the interconnect circuitry 210. For example, the SoC 100 may be arranged so that the interconnect circuitry 210 passes through the transaction check unit 312 (e.g., so that messages communicated over the interconnect circuitry 210 are to pass through the transaction check unit 312).

The transaction check unit 312 may analyze each message of a transaction communicated over the interconnect circuitry 210. In other examples, the message check unit 312 may analyze a subset (e.g., not every) message of a transaction communicated over the interconnect circuitry 210. For example, the transaction check unit 312 may periodically analyze the messages communicated over the interconnect circuitry (e.g., by analyzing every $n^{th}$ message of a transaction, where n is an integer greater than one). The transaction check unit 312 may analyze messages at periodic time intervals. In other examples that will be described in more detail below, the transaction check unit 312 may select messages to analyze for data errors in dependence on statistical data generated from previous error detections. In other words, the transaction check unit 312 may select messages to analyze using information on previously detected data errors (e.g., using information on detected data errors from previously analyzed messages).

The scanning unit 310 is configured to scan the memory 214 to detect whether there is a data error stored within the memory (e.g., step 403 is performed by the scanning unit 310).

The scanning unit 310 may operate to scan the memory 214 when the interconnect circuitry 210 is free. In other words, the scanning unit 310 may scan the memory 214 at a time when no messages are being communicated over the interconnect circuitry 210. For example, the scanning unit 310 may scan the memory 214 at times when there are no master devices active on the interconnect circuitry 210. This may prevent the memory scanning from interfering with the communication of messages over the interconnect circuitry 210, and is thus non-intrusive.

The scanning unit may not scan the whole of memory 214 at a time, but may instead scan portions of the memory at a time (e.g., where each portion is less than the whole of the memory). The memory 214 may, for example, be formed of a plurality of blocks, and the scanning unit 310 may scan a block of memory at a time. A block in this context refers to a portion of memory. A block may be a contiguous region of the memory 214 but need not be.

The scanning unit 310 may scan the memory 214 by performing scanning operations. The scanning operations may be performed at times when the interconnect circuitry 210 is free and/or when the memory block is free (e.g., at a time when no data is being read from or written to the block). In each scanning operation, the scanning unit 310 may scan a block of the memory 214 to determine whether there is a data error within that block.

To check for data errors within the memory 214, the scanning unit 310 may scan a block of the memory 214 to read the data within that block. An error check may then be performed on the data read from that block to determine whether there is an error in that data. One approach to performing the error detection is for the scanning unit 310 to scan a block of the memory 214 and characterize the data of that block. That characterization may then be compared to a previous characterization of the data in that same block. If the scanning unit 310 knows that no data has been written to that block in the time since the previous characterization, then the scanning unit 310 detects that the block contains a data error in response to determining that the two temporally spaced characterizations of the block data do not match. Likewise, the scanning unit 310 may detect that the block does not contain a data error in response to determining that the two temporally spaced characterizations of the block data do match.

For example, to perform error detection within a block of memory 214, the scanning unit 310 may perform a scanning operation at some time $T_1$ to read the data stored within the block. Having read the data within the block, the scanning unit 310 characterizes the data content of that block by generating a hash value for the block. The hash value may be generated by implementing a hash function on the data read from the block at time $T_1$. The hash function may be implemented by the hashing unit 314. The hash value for the block may then be stored by the scanning unit 310 (e.g., within the detection circuitry 104 to facilitate expedient future access). In this example, the generated hash value may be stored by the scanning unit in the buffer 304.

At some later time $T_2$ subsequent to $T_1$, the scanning unit 310 scans that same block of memory 214 to again read the data stored within that block. The scanning unit 310 then generates a hash value from the data read from the block at the time $T_2$, and compares that generated hash value with the previously generated hash value stored in the buffer 304. If no data has been written to the block in the time between $T_1$ and $T_2$ and the scanning unit 310 determines that the two hash values do match, the scanning unit detects that the block does not contain a data error. In contrast, if no data has been written to the block in the time between $T_1$ and $T_2$ and the scanning unit 310 determines that the two hash values do not match, the scanning unit detects that the block does contain a data error.

In other words, the scanning unit 310 performs error detection within a block of memory by scanning the block at a time $T_2$ to read the data stored in the block. The scanning unit then generates a hash value from the data read at time $T_2$ and compares this generated hash value with a stored, previously generated, hash value for that block (e.g., the hash value generated from data read from the block at the previous time $T_1$). The scanning unit then determines that the memory block does not contain an error in response to determining that the two hash values for the block do match, and detects a data error within the block in response to determining that the two hash values for that block do not match.

The scanning unit 310 may be configured to only scan a block at times subsequent to the previous time if no data is written to the block in the time since that previous time.

This is because if data is written to the block, the hash value generated from the data within the block will change and so not match the previously generated hash value for that block, even if there is no error within the data. Thus, a condition on performing the scan of a block at a time $T_2$ to compare a hash value generated from the read data to a hash value generated from the data read at a previous time $T_1$ may be that no data is written to the block in the time between $T_1$ and $T_2$.

Alternatively, the scanning unit 310 may operate in a mode in which the scanning unit 310 performs error detection on real-time moving data. In this case, the scanning unit 310 may scan a block at a first time $T_1$ and a second time $T_2$ subsequent to $T_1$ when data is intended, or expected, to have been written to the block within the time interval between $T_1$ and $T_2$. The scanning unit 310 characterizes the data content of the block at time $T_1$ and at the time $T_2$. The scanning unit then compares the characterizations of the data content of the block at the times $T_1$ and $T_2$ and determines that there is an error if the characterizations do match (e.g., because it is known that the data within the block should have changed within the time interval $T_1$-$T_2$). This error is not necessarily just an error in the data but may be indicative of an error within the SoC more generally, the error preventing data being written to the block. The scanning unit 310 may again characterize the data contents of the block at times $T_1$ and $T_2$ by generating a hash value from the data read from the block at times $T_1$ and $T_2$, respectively.

The scanning unit 310 may scan only a subset of the blocks of the memory 214. In some examples, the scanning unit 310 may scan only a single block of the memory 214; in other examples, the scanning unit 310 scans a plurality of blocks of the memory 214. The scanning unit 310 may scan all blocks of the memory 214. Thus, in general, the scanning unit 310 operates to scan one or more blocks of the memory 214. The scanning unit 310 may scan the blocks according to some specified block order. In other words, the scanning unit 310 may select the next block of memory 214 to scan according to some block order.

In other examples, the scanning unit 310 may select the memory blocks to scan for error detection that are expected to be used in an upcoming transaction over the interconnect circuitry 210. In other words, the scanning unit 310 may scan a block of memory 214 to perform error detection in that block in response to detecting that the block is expected, or scheduled, to be used in a transaction over the interconnect circuitry 210 (e.g., the block is scheduled to have data written to, or read from, it by a device on the SoC 100). The scanning unit 310 may scan the block in advance of the time the block is expected, or scheduled to be used.

The scanning unit 310 may determine that a block of memory 214 is scheduled to be used in an upcoming transaction from an analysis of the messages communicated over the interconnect circuitry 210. This is possible because some of the messages communicated over the interconnect circuitry specify addresses within the memory 214. If a message forming part of a transaction specifies an address contained within some block B of the memory 214, the block B containing that address may be determined to be a block scheduled for use in the transaction. For example, a message communicated over the interconnect circuitry may specify that data is to be written to or read from an address of memory 214 within a particular block B. In other words, the message may be a 'write message' or a 'read message' that indicates the address in memory 214 the data is to be written to or read from. An analysis of the content of this message may therefore indicate that block B is scheduled for use. In response to this determination, the scanning unit 310 may scan the block B to determine whether the block contains a data error. The scanning unit 310 may scan block B when the interconnect circuitry is next free.

The analysis of the messages to detect blocks scheduled or expected for use may be performed by the error detection unit 302. Conveniently, the analysis of the messages to detect blocks scheduled or expected for use as part of a transaction may be performed by the transaction check unit 312. This analysis may be performed as part of the analysis performed to detect whether a message contains a data error (e.g., the analysis of the messages to identify blocks scheduled for use may be performed by the transaction check unit 312 as part of its analysis when performing act 401 of the method shown in FIG. 4). This may make efficient use of the processing performed by the transaction check unit 312.

Thus, in some examples, for each message analyzed by the transaction check unit 312 to detect whether the message contains a data error, the transaction check unit 312 may additionally analyze the message to determine whether that message specifies an address within the memory 214 indicating the block containing that address is scheduled for use. If the transaction check unit 312 determines that an analyzed message does specify an address within a block that indicates the block is scheduled for use, the transaction check unit 312 may communicate an indication of that block to the scanning unit 310. In response to receiving that indication, the scanning unit 310 may next scan that block (e.g., the next time the interconnect circuitry is free).

In other examples, the analysis of messages to detect memory blocks scheduled or expected for use may be performed by the scanning unit 310. This approach has the advantage of enabling the analysis of messages to identify blocks scheduled for use and the analysis of messages for error detection to be performed independently of each other. This may be provided if it is desirable to analyze different messages for each purpose.

Thus, to summarize the examples above, the error detection unit 302 performs two types of error detection: a first type of error detection to determine whether transactions communicated over the interconnect circuitry contain a data error; and a second type of error detection to determine whether one or more blocks of memory contain a data error.

In some examples, information associated with the data errors detected by the error detection unit 302 over time may be recorded to generate an error profile. This may be performed by the profile unit 308. The error profile may be composed of one or more parameters, referred to herein as error parameters. The set of error parameters may define the error profile. Values for the set of error parameters may be set and updated as data errors are detected by the error detection unit 302. The error profile may characterize the previously detected data errors (e.g., the data errors detected over a previous period of time). The previously detected data errors may be characterized by the values of the error parameters. The error profile may be generated for both the data errors detected in messages, and the data errors detected in the one or more blocks of the memory. In other examples, the error profile may be generated only for data errors detected in the one or more blocks of memory or for data errors detected in messages.

To build up the error profile, the profile unit 308 may record information (e.g., statistics) on data errors detected by the error detection unit 302 over time. The recorded information may then be used by the profile unit 308 to update the values of the error parameters. The error profile may be updated over time as data errors are detected by the error detection unit 302. In other words, the error parameter values may not be static but may change over time as more data errors are detected and recorded in the profile unit 308. The values of the error parameters may, for example, be averaged over time.

An example error parameter may be, for example, the number of data errors detected over one or more specified time intervals (e.g., the frequency of detected data errors). This error parameter may be determined by the clock 306 and the profile unit 308. For example, the profile unit may receive a clock signal from clock 306. The error detection unit 302 may send an error detection signal to the profile unit 308 each time a data error is detected. This signal indicates that a data error has been detected. The profile unit 308, in response to receiving the signal from the error detection unit 302, records that a data error has been detected at a time value specified by the clock signal from clock 306. In other words, the profile unit 308 may record the time at which each data error is detected using a timing signal from clock 306. In other words, the profile unit 308 may timestamp each data error detection using the clock 306. The profile unit 308 may use the recorded information on the time values each data error is detected to calculate the frequency of detected data errors for one or more time intervals.

Another example error parameter may be, for example, the number or frequency of detected data errors for each block of memory 214. To calculate this error parameter, the error detection unit 302 may send an error detection signal to the profile unit 308 each time a data error in memory 214 is detected. This signal may be sent by the scanning unit 310. This error detection signal may indicate: (i) that a data error has been detected in memory 214; and (ii) the data block of the memory in which the data error was detected. The profile unit 308 may use these error detection signals to record the number of data errors detected within each block of the memory 214. The profile unit 308 may also calculate the frequency of data errors detected in each block of memory 214 over one or more time intervals using the clock signal provided by clock 306. In other words, the profile unit 308 may record, for each data block, the time value at which each data error within that block is detected by the error detection unit 302. The profile unit 308 may then calculate the frequency of detected data errors for each block of memory 214 from this recorded information.

The error profile generated by the profile unit 308 may be used to guide, or direct, the operation of the error detection unit 302 in detecting data errors in transactions communicated over the interconnect circuitry 210 and/or within the memory 214.

In one example, the generated error profile may be used by the error detection unit 302 to select transactions, or messages of transactions, communicated over interconnect circuitry 210 to analyze for data errors. The error detection unit 302 may analyze transactions/messages communicated at certain times, or within certain time intervals, selected using the error profile. For example, the error detection unit 302 may analyze each message communicated within a specified time interval for data errors if the error profile indicates the historical frequency of data errors within that time interval exceeds some specified threshold.

In another example, the generated error profile may be used by the error detection unit 302 to select which block of memory 214 to scan for data errors. The error profile may further be used to select which block of memory 214 to scan for data errors and the time interval the block is to be scanned in. For example, the error detection unit 302 may scan the blocks according to some priority order determined from the error profile. The priority order may, for example, be set by the number or frequency of data errors detected within each block. The error detection unit may then prioritize blocks having a greater number or frequency of detected data errors. This enables the error detection unit 302 to prioritize scanning blocks with a propensity for data errors. Alternatively, or in addition, the error detection unit 302 may scan blocks of the memory 214 within time intervals selected from the error profile. The error detection unit 302 may, for example, scan the blocks within a time interval if the error profile indicates the number or frequency of data errors detected within that time interval exceeds a specified threshold.

Thus, in summary, the error detection unit 302 may analze messages of transactions communicated over interconnect circuitry 210 and/or scan blocks of memory 214 to detect data errors in dependence on the error profile generated by the profile unit 308.

In another example, the profile unit 308 may generate a behavioral or activity profile for the SoC 100. This activity profile may represent, or characterize, the behaviour of the SoC in normal or typical working conditions. In other words, the activity profile may characterize aspects of the typical, or normal, behaviour of the SoC 100. The activity profile may be composed of one or more parameters, referred to herein as activity parameters. The set of activity parameters may define the activity profile. Values for the set of activity parameters may be updated over time as the profile unit 308 monitors behaviour of the SoC 100.

The activity profile may, for example, characterize the activity over the interconnect circuitry 210 (e.g., by characterizing transaction activity over the interconnect circuitry. Alternatively, or in addition, the activity profile may characterize activity of the memory 214 (e.g., by characterizing the read and/or write accesses to the memory). The activity profile may characterize the activity of each block of memory 214 (e.g., by characterizing the read and/or write accesses to each block of the memory). The activity profile may be generated by the profile unit 308 (e.g., values for the activity parameters may be set) by recording information indicative of activity levels of the interconnect circuitry 210 and/or memory 214.

Some example activity parameters will now be discussed.

The set of activity parameters may, for example, include the number of transactions communicated over the interconnect circuitry 210 over one or more specified time intervals and/or the frequency of transactions over one or more specified time intervals. To measure this parameter, the profile unit 308 may be connected directly to the interconnect circuitry 210 to enable the number of transactions to be recorded by monitoring the transactions over the interconnect circuitry 210. The profile unit 308 may record a time value associated with each transaction monitored over the interconnect circuitry 210 using the timing signal received from the clock 306. The profile unit 308 may then use the monitored transactions and the time value associated with each monitored transaction to calculate a value for the number of transactions occurring over one or more time intervals. From this, the frequency of transactions for each time interval may be calculated (e.g., using the value of the time interval). The values (e.g., the transaction number values and/or frequency values) may be updated over time as the profile unit monitors the interconnect circuitry 210. The values may, for example, be averaged over time.

Alternatively, or in addition, the set of activity parameters may include the number of accesses to memory (e.g., the number of read accesses, the number of write accesses, or both) over one or more specified time intervals and/or the frequency of memory accesses over one or more time intervals. The activity parameters may include the number and/or frequency of accesses to memory over one or more time intervals for each block of the memory. To measure this parameter, the profile unit 308 may be connected directly to memory 214. Alternatively, the profile unit 308 may record accesses to memory using information obtained by the transaction check unit 312.

For example, the transaction check unit 312 may determine from an address within the address field of a message that that message is a memory access request message. Thus, the profile unit may record accesses to the memory (e.g., either for each block of the memory or for the memory as a whole). The profile unit 308 may additionally record a time value associated with each memory access (e.g., for each memory block or for the memory as a whole) using the timing signal received from the clock 306. The profile unit 308 may then use the recorded accesses and the time value associated with each recorded access to calculate a value for the number of memory accesses occurring over one or more time intervals (e.g., per block or for the memory as a whole). From this the frequency of memory accesses for each time interval may be calculated (e.g,. using the value of the time interval). The values (e.g., the memory access number values and/or frequency values) may be updated over time as the profile unit records additional memory accesses. The values may, for example, be averaged over time.

The activity profile generated by the profile unit 308 may be used to guide, or direct, the operation of the error detection unit 302 in detecting data errors in transactions communicated over the interconnect circuitry 210 and/or within the memory 214.

For example, the generated activity profile may be used by the error detection unit 302 to select transactions, or messages of transactions, communicated over interconnect circuitry 210 to analyze for data errors. The error detection unit 302 may analyze transactions/messages communicated at certain times, or within certain time intervals, selected using the activity profile. For example, the error detection unit 302 may analyze transactions occurring within specified time intervals indicated by the activity profile to have an activity level exceeding a specified threshold (e.g., within time intervals for which the activity profile indicates the historical number and/or frequency of transactions for that time interval exceeds a specified threshold). This may be based on the assumption that an error is more likely to occur within a time interval in which the frequency of transactions is greater.

In another example, the generated activity profile may be used by the error detection unit 302 to select which block of memory 214 to scan for data errors and/or when to scan the block for data errors. The activity profile may be used to select which block of memory 214 to scan for data errors and the time interval the block is to be scanned in. For example, the error detection unit 302 may scan the blocks according to some priority order determined from the activity profile. The priority order may, for example, be set by the number or frequency of accesses detected within each block as indicated by the activity profile. The error detection unit may then prioritize blocks having a greater number or frequency of detected accesses. This enables the error detection unit 302 to prioritize scanning blocks with a higher number of accesses, which may be the blocks more likely to contain data errors.

Alternatively, or in addition, the error detection unit 302 may scan blocks of the memory 214 within time intervals selected from the activity profile. The error detection unit 302 may, for example, scan the blocks within a time interval if the activity profile indicates the number or frequency of historical accesses within that time interval exceeds a specified threshold.

Thus, in summary, the error detection unit 302 may analyze messages of transactions communicated over interconnect circuitry 210 and/or scan blocks of memory 214 to detect data errors in dependence on an activity profile generated by the profile unit 308 that characterizes the behaviour of the interconnect circuitry 210 and/or memory 214 under normal, or typical, operating conditions.

The error detection unit 302 may analyze messages of transactions communicated over interconnect circuitry 210 and/or scan blocks of memory 214 to detect data errors in dependence on both the activity profile and the error profile.

Returning back to FIG. 4, and at act 405 the detection circuitry 104 performs a dedicated action in response to detecting a data error within the chip 100. In other words, the detection circuitry performs a dedicated action in response to detecting a data error within a transaction communicated over the interconnect circuitry and/or a data error within the memory 214.

In some examples, the detection circuitry 104 may perform the dedicated action each time a data error is detected. In other words, a dedicated action may be performed in response to a data error being detected in a transaction communicated over the interconnect circuitry 210 or a data error being detected in a block of memory. In other examples, the detection circuitry 104 may perform a dedicated action only in response to a data error being detected in both a transaction being communicated over the interconnect circuitry and in a block of memory.

The dedicated action may be performed by the error detection unit 302. The dedicated action may be indicative of the detection of a data error. The dedicated action may, for example, be a remedying action to remedy the data error. The dedicated action may be a preventative action to prevent propagation of the data error through the chip 100. The dedicated action may be an alerting action to alert a component (e.g., either on or off-chip) that a data error has been detected. The error detection unit 302 may perform more than one dedicated action in response to detecting a data error. In general, the error detection unit 302 may perform one or more dedicated actions in response to detecting a data error.

Examples of dedicated actions performed by the detection circuitry 104 include: correcting the detected data error; generating an alert signal that is output from the detection circuitry 104 (and potentially output from the chip 100 to an off-chip component such as debug controller 216); outputting trace data; and blocking an operation involving the data error (e.g. blocking further communication of a message containing a data error, or blocking access to the block of memory containing the data error). Each of these example dedicated actions will now be described in more detail.

The detection circuitry 104 (e.g. the error detection unit 302) may correct a data error detected in a transaction or detected within the memory.

To correct a data error in a transaction communicated over the interconnect circuitry, the error detection unit 302 may adjust part of the data within the message forming part of the transaction that contains the error and then re-perform the check calculation on the message that includes the adjusted data (e.g., the CRC check or parity check). The error detection unit 302 may repeatedly perform the acts of: i) adjusting part of the data within the message of the transaction; and ii) re-performing the check calculation on the message that includes the adjusted data, until the error detection unit determines that the message no longer contains a data error (e.g., until the data error is corrected). The error detection unit 302 may, for example, sequentially adjust each bit of the message in turn and re-perform the check calculation after adjusting each bit. These acts may be performed by the transaction check unit 312 of the error detection unit 302. If multiple messages of a transaction are determined to contain a data error, the error detection unit 302 may correct the errors within each message.

Having corrected the data error within the message of a transaction, the error detection unit 302 may communicate the corrected message over the interconnect circuitry 210. The corrected message may be communicated in place of the message that contained the data error. To do this, the error detection unit 302 may extract messages from the interconnect circuitry 210 when analyzing those messages for data errors. Alternatively, the corrected message may be communicated over the interconnect circuitry in addition to the message containing the error (e.g., if the error detection unit 302 analyzes messages communicated over the interconnect circuitry 210 but does not extract the messages).

To correct a data error in a block of the memory 214, the error detection unit 302 may perform the following acts: (i) adjust part of the data within the block; (ii) re-characterize the data within the block (e.g., by re-performing the hash calculation on the block data containing the adjusted data to generate a hash value); (iii) compare the characterization of the block (e.g., the generated hash value) to the stored characterization of the block (e.g., the stored hash value for that block). If the characterizations match, the error detection unit 302 then determines that the error in the block has been corrected. If the characterizations do not match, the error detection unit 302 determines that the error in the block has not been corrected. Acts (i) to (iii) may then be repeated until the generated characterization for the block matches the stored characterization for that block (e.g., until the data error within the block has been corrected). These acts may be performed by the scanning unit 310 of the error detection unit 302.

After correcting the data error within the block, the error detection unit 302 may write the corrected data for the block back to memory 214. In other words, the data stored within the block of memory 214 is replaced by the corrected data generated by the error detection unit 302.

If a data error is detected within a transaction, the detection circuitry 104 (e.g., the error detection unit 302) may block an operation involving that transaction. If a data error is detected within the memory 214, the detection circuitry 104 (e.g., error detection unit 302) may block an operation involving that data.

For example, the error detection unit 302 may, in some examples, extract messages of a transaction from the interconnect circuitry 210 to analyze those messages under act 401 above. If an error is detected in a message when the message is analyzed, that message may not be communicated back over the interconnect circuitry. In other words, the error detection unit 302 may remove the message from the interconnect circuitry 210. In contrast, if an analyzed message is determined not to contain a data error, the error detection unit 302 re-communicates the message over the interconnect circuitry 210.

To block an operation involving the memory 214, the error detection unit 302 may block further access to the erroneous data within that memory 214. For example, if the memory 214 is formed of blocks and a data error is detected within one of the blocks, the error detection unit 302 may prohibit further access to that block of memory 214 (e.g., by blocking read or write accesses to that block of memory 214). One way to do this would be to assert a lock on the pathway to that block of memory 214. The lock may, for example, be asserted on a region of the interconnect circuitry 210. The asserted lock may restrict read or write messages along the pathway that involve the block of memory containing the data error. In other words, the asserted lock may restrict the passage of all read or write messages involving the block of memory containing the data error.

The alert signal may be generated by the error detection unit 302. The alert signal may be generated by either of the scanning unit 310 or the message check unit 312 (e.g., depending on the type of error detected). An alert signal is illustrated schematically at 316 in FIG. 3. The alert signal may be communicated to another device of the SoC 100. Alternatively, the alert signal may be communicated off-chip (e.g., to debug controller 216 via the communication interface 212). The alert signal indicates that a data error has been detected and enables appropriate action to be taken by other components Of the SoC.

Trace data may be output by the error detection unit 302. The trace data may be output to an off-chip entity (e.g., to debug controller 216 via communication interface 212). The trace data may contain information on where the data error was detected and/or the time the data error was detected. The trace data may, for example, indicate the type of message containing the data error, or an indication of where the data error is stored in memory (e.g., the block containing the data error).

In summary, according to the examples described above, the detection circuitry 104 is configured to perform one or more dedicated actions in response to detecting a data error within a transaction communicated over the interconnect circuitry 210 and/or a data error within memory 214.

The detection circuitry 104 described herein may be configured to operate for the purpose of chip safety, chip security, or chip analytics. In the context of the present disclosure, chip security may relate to detecting data errors on the chip that have potential malicious intent for the purpose of third party gain. Chip safety may relate to detecting data errors on the chip that has more severe potential consequences (e.g., a dangerous effect on the wider system in which the chip is implemented). Chip analytics may relate to analyzing the behaviour of the chip to gain a further understanding of how the chip functions or operates. Chip analytics may be performed by dedicated analytics software, potentially being executed off-chip.

The dedicated action performed by the detection circuity may be dependent on the context in which the detection circuitry is operating (e.g., the context of chip safety, chip security or chip analytics). For chip security, the dedicated action performed by the detection circuity may be to prevent a security breach from occurring. For chip safety, the dedicated action performed by the detection circuity may be to prevent a safety breach from happening. For example, in the context of chip safety, data errors may result in the detection circuitry performing a more severe dedicated action, such as shutting down or disabling the chip (or at least parts of the chip).

Each component of the SoCs illustrated in FIGS. 1 to 3 may be implemented in dedicated hardware. Alternatively, each component of the SoC illustrated in FIGS. 1 to 3 may be implemented in software. Some components may be implemented in software, while other components are implemented in dedicated hardware.

The detection circuitry 104 including any sub-units and communication interfaces may be hardware circuits forming part of SoC 100. The components of the detection circuitry for controlling and/or monitoring complex core devices and peripherals such as processors may use suitably complex state machines as part of their control unit.

Suitably, communication interfaces use suitably complex state machines to implement their complex protocols. Various approaches to realizing state machines are known. Such state machines may be realized using: (i) only logic gates; (ii) a combination of logic gates and memory, where the memory is used to contain tables of values to simplify the operation of the state machine or to make it programmable; or (iii) a processor core to execute software stored in memory. Where a processor core is used, the processor core may be: (i) integral to the sub-unit, communication interface, or other monitoring circuitry; or (ii) shared between a number of units to reduce implementation resources and cost for the number of units.

The SoC described may be incorporated within a computing-based device. The computing-based device may be an electronic device (e.g., a smartphone, smartwatch, laptop, PC, or some other device that is a component part of a wider computing system, such as a video processor, a control system (for controlling electric motors, battery, an energy management system in automotive applications), an engine control unit (ECU), etc). Suitably, the computing-based device includes one or more processors for processing computer executable instructions to control operation of the device in order to implement the methods described herein. The computer executable instructions may be provided using any computer-readable media such as a memory. The computer-readable media may be non-transitory. The methods described herein may be performed by software in a machine readable form on a tangible storage medium. Software may be provided at the computing-based device to implement the methods described herein.

The above description provides the system circuitry and detection circuitry as being included on the same SoC. In an alternative implementation, the system circuitry and detection circuitry are included across two or more integrated circuit chips of an MCM. In an MCM, the integrated circuit chips are typically stacked or located adjacently on an interposer substrate. Some system circuitry may be located on one integrated circuit chip, and other system circuitry may be located on a different integrated circuit chip of the MCM. Similarly, the monitoring circuitry may be distributed across more than one integrated circuit chip of the MCM. Thus, the method and apparatus described above in the context of an SoC also apply in the context of an MCM.

The detection circuitry 104 is illustrated in the examples herein as forming part of the integrated circuit chip. However, it will be understood that the detection circuitry (and its associated functionality as described herein) may be incorporated into an off-chip device (e.g., off-chip debugger 216). Such an off-chip device may include the blocks of the detection circuitry shown in FIG. 3.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description, it will be evident to a person skilled in the art that various modifications may be made within the scope of the invention.

What is claimed is:

1. A method of performing error detection within an integrated circuit chip, comprising:
   analyzing transactions communicated over interconnect circuitry of the integrated circuit chip to detect whether a transaction contains a data error, wherein the analyzing comprises performing, on one or more messages of each transaction, a parity check to detect whether a message of the one or more messages contains a data error, or a cyclic redundancy check to detect whether the message contains a data error;
   scanning a memory of the integrated circuit chip coupled to the interconnect circuitry to detect whether there is a data error stored in the memory, wherein the scanning is performed at times when the interconnect circuitry is free; and
   in response to detecting a data error in a transaction communicated over the interconnect circuitry and/or a data error stored in the memory, performing a dedicated action indicative of a data error.

2. The method as claimed in claim 1, wherein the step of scanning the memory of the integrated circuit chip is performed by detection circuitry coupled to the interconnect circuitry.

3. The method as claimed in claim 1, wherein the step of scanning the memory of the integrated circuit chip comprises scanning one or more blocks of the memory to detect whether the one or more blocks contain a data error by:
   scanning that block of the memory at a first time;
   generating a first characterization of the data read from the block at the first time and storing that first characterization;
   scanning that block of memory at a second time subsequent to the first time;
   generating a second characterization of the data read from the block at the second time and comparing the second characterization to the first characterization; and
   detecting that the data in the block contains an error if the first and second characterizations do not match.

4. The method as claimed in claim 3, wherein the block of memory is scanned at the second time only if no data has been written to that block between the first time and the second time.

5. The method as claimed in claim 3, wherein the first characterization is a first hash value generated from the data read from the block at the first time, and the second characterization is a second hash value generated from the data read from the block at the second time.

6. The method as claimed in claim 3, wherein the method comprises scanning a block of the memory to detect whether that block contains a data error in response to detecting that the block is scheduled to be used in a communication over the interconnect circuitry.

7. The method as claimed in claim 6, wherein the method comprises detecting that the block is scheduled to be used in a communication over the interconnect circuitry in response to identifying a message of a transaction over the interconnect circuitry specifying an address within that block.

8. The method as claimed in claim 3, wherein the one or more scanned blocks of memory comprise blocks of read-only memory.

9. The method as claimed in claim 1, wherein the step of scanning the memory of the integrated circuit chip comprises scanning one or more blocks of the memory to detect whether the one or more blocks contain a data error by:
   scanning that block of memory at a first time;
   generating a first characterization of the data read from the block at the first time and storing that first characterization;
   scanning that block of memory at a second time subsequent to the first time;
   generating a second characterization of the data read from the block at the second time and comparing the second characterization to the first characterization; and
   detecting that the data in the block contains an error if the first and second characterizations do match.

10. The method as claimed in claim 9, wherein the first characterization is a first hash value generated from the data read from the block at the first time, and the second characterization is a second hash value generated from the data read from the block at the second time.

11. The method as claimed in claim 1, wherein the dedicated action performed in response to detecting data error in the memory comprises one or more of:
    correcting the error in the data and writing the corrected data back to the memory;
    generating an alert signal; and
    blocking access to the data error in the memory.

12. The method as claimed in claim 1, wherein the dedicated action performed in response to detecting a data error in a message of a transaction communicated over the interconnect circuitry comprises one or more of:
    correcting the error and communicating a message containing corrected data;
    communicating an indication of the error to an entity from which the message was communicated; and
    generating an alert signal.

13. The method as claimed in claim 1, wherein the method further comprises recording information associated with detected data errors in transactions communicated over the interconnect circuitry and/or detected data errors stored in the memory over time to generate an error profile.

14. The method as claimed in claim 13, wherein the method comprises analyzing transactions communicated over the interconnect circuitry selected in dependence on the error profile.

15. The method as claimed in claim 13, wherein the step of scanning the memory of the integrated circuit chip comprises scanning one or more blocks of the memory to detect whether the one or more blocks contain a data error,
    wherein the one or more blocks of the memory are selected in dependence on the error profile, and
    wherein the method comprises scanning the memory at selected times in dependence on the error profile.

16. The method as claimed in claim 1, further comprising recording information indicative of activity levels of the interconnect circuitry and/or memory over time to generate an activity profile.

17. The method as claimed in claim 16, wherein the method comprises analyzing transactions communicated over the interconnect circuitry within a time interval indicated by the activity profile to have a level of activity exceeding a specified threshold.

18. The method as claimed in claim 16, wherein the step of scanning the memory of the integrated circuit chip comprises scanning one or more blocks of the memory to detect whether the one or more blocks contain a data error, and the method comprises scanning one or more blocks of memory selected in dependence on the activity profile and/or scanning the memory at selected times in dependence on the activity profile.

19. The method as claimed in claim 1, wherein, when the cyclic redundancy check is performed, the message communicated over the interconnect circuitry includes a check value, and wherein the check value depends upon a remaining content of the message.

20. The method as claimed in claim 19, further comprising:
checking the transaction using a transaction check unit;
analyzing, by the transaction check unit, the message by re-calculating the check value based on the content of the message; and
comparing, by the transaction check unit, the re-calculated check value to the check value within the message.

21. The method as claimed in claim 19, further comprising:
detecting, by the transaction check unit, that the message does not contain a data error when the check values match; and
detecting, by the transaction check unit, that the message does contain a data error when the check values do not match.

22. An integrated circuit chip, comprising:
interconnect circuitry configured to transport messages;
a memory coupled to the interconnect circuitry; and
detection circuitry configured to:
analyze transactions communicated over interconnect circuitry of the integrated circuit chip to detect whether there is a data error stored in the memory, the analysis of the transactions comprising performing, on one or more messages of each transaction, of a parity check to detect whether that message contains a data error, or a cyclic redundancy check to detect whether that message contains a data error;
scan the memory at times when the interconnect circuitry is free to detect whether data stored in the memory contains an error; and
in response to detecting a data error in a transaction communicated over the interconnect circuitry and/or an error in the data stored in the memory, perform a dedicated action indicative of a data error.

* * * * *